United States Patent
Kawano et al.

[11] Patent Number: 6,066,558
[45] Date of Patent: May 23, 2000

[54] MULTILEVEL INTERCONNECTION FORMING METHOD FOR FORMING A SEMICONDUCTOR DEVICE

[75] Inventors: Yumiko Kawano, Kofu; Shigetoshi Hosaka, Yamanashi-ken; Yuichi Wada, Chiba-ken; Hiroshi Kobayashi; Tetsuya Yano, both of Kofu, all of Japan

[73] Assignee: Tokyo Electron Limited, Tokyo, Japan

[21] Appl. No.: 08/796,695

[22] Filed: Mar. 4, 1997

[30] Foreign Application Priority Data

Mar. 5, 1996 [JP] Japan ................................. 8-075279

[51] Int. Cl.[7] ................................. H01L 21/4763
[52] U.S. Cl. .................... 438/642; 438/660; 438/656; 438/674; 438/688
[58] Field of Search .................... 438/688, 660, 438/656, 674, 675, 685, 642

[56] References Cited

U.S. PATENT DOCUMENTS 5,169,803  12/1992  Miyakawa .
5,637,534   6/1997  Takeyasu et al. .................... 438/637
5,789,317   8/1998  Batra et al. .

FOREIGN PATENT DOCUMENTS 7-99247   4/1995  Japan .
7-135250  5/1995  Japan .

*Primary Examiner*—Caridad Everhart
*Attorney, Agent, or Firm*—Oblon, Spivak, McClelland, Maier & Neustadt, P.C.

[57] ABSTRACT

The multilevel interconnection forming method of the present invention comprises the following. A metal film containing aluminum is deposited on an insulating film of a substrate, and the metal film is patterned, to form a wiring layer of a first layer. An interlayer dielectric film forming part of the first layer is formed on an entire surface of the substrate, such that the interlayer dielectric film covers the wiring layer from upside. A hole is formed at a predetermined position of the interlayer dielectric film such that the hole reaches the wiring layer of the first layer. Aluminum is selectively deposited and filled into the hole by a CVD method, such that the aluminum is filled at a volume ratio smaller than 100% with respect to the hole. An active metal film is formed on an entire upper surface of an interlayer dielectric film including the hole filled with the aluminum. A metal layer containing aluminum is formed on the active metal film. The metal layer is made to flow into the hole by reflowing, to completely fill the hole and to planarize the surface of the metal layer. The metal layer is subjected to be patterned, to form a wiring layer of a second layer, after the surface of the metal layer is planarized by the reflowing.

19 Claims, 5 Drawing Sheets

FIG. 5

| CONDITIONS | MODES | REMOVAL OF NATURALLY OXIDIZED FILM (Ar PLASMA PROCESSING) (Å) | ACTIVE METAL FILM (Ti THICKNESS) (Å) | ACTIVE METAL FILM TEMPERATURE (Ti FILM FORMING TEMPERATURE) (°C) | METAL LAYER TEMPERATURE (Al FILM FORMING TEMPERATURE) (°C) | REFLOWING TEMPERATURE (°C) | EVALUATION CHAIN RESISTANCE (Ω/PLUG) | EVALUATION CHAIN YIELD (%) | EVALUATION EM LIFETIME (hors) |
|---|---|---|---|---|---|---|---|---|---|
| COMPARATIVE EXAMPLE | SPUTIERING CONDITION OF PRIOR ART | 300 | — | — | 150 | — | 8.9±10.2 | 43 | 5 |
| EMBODIMENT 1 | BEST MODE | 300 | 50 | 30 | 100 | 400 | 0.3±0.2 | 100 | 105 |
| EMBODIMENT 2 | Ar PLASMA PROCESSING AMOUNT (UNDER) | 50 | 50 | 30 | 100 | 360 | 12.3±9.2 | 26 | 12 |
| EMBODIMENT 3 | Ar PLASMA PROCESSING AMOUNT (OVER) | 600 | 100 | 50 | 100 | 400 | 1.3±0.7 | 30 | 28 |
| EMBODIMENT 4 | Ti THICKNESS (UNDER) | 200 | 10 | 50 | 100 | 400 | 10.9±12.3 | 16 | 10 |
| EMBODIMENT 5 | Ti THICKNESS (OVER) | 200 | 400 | 50 | 100 | 400 | 3.2±1.4 | 82 | 32 |
| EMBODIMENT 6 | Ti TEMPERATURE (OVER) | 300 | 100 | 100 | 100 | 400 | 8.5±5.2 | 35 | 35 |
| EMBODIMENT 7 | Al FILM FORMING TEMPERATURE (OVER) | 300 | 50 | 30 | 250 | 400 | 5.2±2.3 | 52 | 38 |
| EMBODIMENT 8 | REFLOWING TEMPERATURE (UNDER) | 300 | 100 | 50 | 100 | 300 | 7.3±8.2 | 45 | 15 |
| EMBODIMENT 9 | REFLOWING TEMPERATURE (OVER) | 200 | 100 | 50 | 100 | 500 | 0.3±0.1 | 100 | 113 |

MULTILEVEL INTERCONNECTION FORMING METHOD FOR FORMING A SEMICONDUCTOR DEVICE

BACKGROUND OF THE INVENTION

The present invention relates to a multilevel interconnection forming method for forming a semiconductor device.

In general, a semiconductor device tends to have a circuit configuration arranged in a multilevel interconnection structure. In this multilevel interconnection structure, contact holes serve as connecting portions between a device of a lower layer and an aluminum interconnection wiring of an upper layer, and via holes serve as connecting portions between aluminum interconnection wirings of upper and lower layers. Therefore, techniques for filling contact holes and via holes are significant for obtaining electric connection between a wiring and a device or between wirings each other. Hence, these holes are filled by forming an aluminum film by sputtering, or these holes are filled by forming a tungsten film by CVD (Chemical Vapor Deposition). For example, following three methods are known as a method for filling a connecting hole between wirings.

Sputtering Method

With a substrate heated to a high temperature of 450° C. or more, an aluminum film is formed on the substrate by sputtering, so that a hole is filled by the aluminum film. Otherwise, with a processing vessel set to 1 air pressure or more, an aluminum film is formed on a substrate by sputtering, so that a hole is filled by the aluminum film.

Selective Tungsten Film Forming Method

On the basis of a property that a tungsten film is selectively deposited on a surface of electrically conductive material, a tungsten film is deposited on conductive material at a bottom of the hole, thereby to fill a hole.

All Surface Film Forming Etch Back Method

Using, for example, a $WF_6$ gas as a treatment gas, a strong reducing gas such as an $SiH_4$ (mono-silane) gas is made react with the $WF_6$ gas, causing a gas phase reaction, so that a tungsten film is formed on the entire surface of a substrate, thereby to fill a hole. After the hole is filled with the tungsten film, etching-back is carried out to remove unnecessary portions of the tungsten film which are formed on the other part than the hole.

Among the above three methods, the all surface film forming etch back method which is used most mainly will be explained in details below with reference to FIGS. 6A to 6E.

FIGS. 6A to 6E show a procedure in which a via hole electrically connecting interconnection wirings is filled by the all surface film forming etch back method. As shown in FIG. 6A, an insulating film 4 made of, for example, $SiO_2$ is formed on a substrate 2 of a semiconductor wafer. On the insulating film 4, a first wiring layer 6 made of a patterned aluminum film is formed. An anti-reflection film 8 made of, for example, a TiN film for performing excellent resist exposure is formed on the first wiring layer 6. In the figure, the reference numeral 10 denotes an interlayer dielectric film made of, for example, $SiO_2$, and this interlayer dielectric film 10 covers all the upper surface of the substrate 2. In this case, respective electric elements are entirely covered by the interlayer dielectric film 10.

A via hole 12 is formed such that the hole reaches a first wiring layer 6 situated below the hole, at a predetermined position of the interlayer dielectric film 10. In case where the via hole 12 is filled by a tungsten film, a contact resistance may be increased or contact between tungsten and aluminum (of the first wiring layer 6) may be deteriorated, by a suction effect caused between tungsten and aluminum (of the layer 6) if tungsten of the tungsten film has a direct contact with aluminum (of the first wiring layer 6). In order to avoid such a drawback, a barrier metal 14 made of, for example, a Ti film or a TiN film is formed on the entire surface including the inner surfaces of the via hole 12, as shown in FIG. 6B, before filling the via hole 12 with a tungsten film. Thereafter, as shown in FIG. 6C, a tungsten film 16 is formed over the entire surface of the barrier metal 14, for example, by CVD. The via hole 12 is thus filled by the tungsten film 16. In the next, as shown in FIG. 6D, unnecessary surface portions of the tungsten film 16 and the barrier metal 14 are removed by etch back, to expose an interlayer dielectric film 10, and a second patterned wiring layer 18 made of aluminum is formed on the interlayer dielectric film 10 thus exposed (see FIG. 6E). Therefore, the second wiring layer 18 is electrically connected with the first wiring layer 6 through tungsten filled in the via hole 12.

Meanwhile, according to the sputtering method mentioned before, sputtering processing is carried out at a high temperature of 450° C. or more, and it is therefore impossible to use organic material having a low dielectric constant and a low heat resistance which is expected as an interlayer dielectric film of the next generation. Further, in the sputtering method, excellent filling of a hole is realized by improving the adhesion of the filling film toward the sidewall of the via hole, and therefore, a TiN film or a Ti film must be provided as an adhesion layer. Accordingly, the number of film forming steps must be increased, and the structure thereby obtained has a higher contact resistance in comparison with a structure in which an Al portion is directly connected with another Al portion.

Further, according to the selective tungsten film forming method, tungsten having a higher resistance than aluminum is used, and therefore, a signal delay is caused, so that the operation speed of the semiconductor device is lowered. Consequently, the device cannot respond especially to a micro-processor or the like which has been required to achieve high speed operation. On the other hand, in the selective tungsten film forming method, upper and lower wiring layers containing aluminum are connected with each other by tungsten, and therefore, electro-migration or corrosion occurs, thereby lowering the reliability of the wirings. Further, if selective loss occurs due to impurities sticking to the surface of conductive material during formation of a tungsten film, a leakage is incurred between wirings.

Even in the all surface film forming etch back method shown in FIGS. 6A to 6E, tungsten having a high resistance is used, and therefore, there appears the same problem as in the selective tungsten film forming method, resulting in a high contact resistance at an interface between films. Also, in the all surface film forming etch back method, a barrier metal 14 which reduces electro-migration to maintain adhesion must be formed, and accordingly, the number of film forming steps is increased, so that a structure thereby obtained has a high resistance ratio in comparison with a structure in which an Al portion is directly connected with another Al portion. In addition, since processing for forming a tungsten film by CVD is carried out at a high temperature of 450° C., low dielectric constant organic material having a low heat resistance cannot be used to form an interlayer dielectric film. Further, since the step coverage of the barrier metal 14 which also works as the adhesion layer decreases as the aspect ratio increases because of down-sizing of connection holes. The short of step coverage suppresses the via filled by tungsten deposition. In the worst case, holes cannot be filled.

As described above, if a via hole is filled with tungsten or aluminum by sputtering, various problems occur. In contrast, if a via hole is filled with aluminum by CVD, above-mentioned problems do not occur. This is because aluminum is the material of low cost with has a low resistance and excellent conductivity and CVD achieves a more excellent step coverage than sputtering to prevent occurrence of voids. Therefore, it is desirable that holes are filled with aluminum by CVD. In this case, however, aluminum is deposited in holes, crystallized with a relatively large grain diameter. Therefore, if aluminum is filled at volume ratio (occupation ratio) of 100% with respect to a hole, to obtain good electric connection between upper and lower layers, aluminum is deposited to nearly overflow from the hole so that a convex portion is formed on the upper side of the hole. If processing is carried out for a wiring to be formed above the hole, with the convex portion remaining there, the focus depth exceeds its tolerance range due to the height of the convex portion, in a photolithography step of the processing. It is therefore impossible to carry out photolithography processing with high accuracy.

BRIEF SUMMARY OF THE INVENTION

The present invention has an object of providing a multilevel interconnection forming method for forming a semiconductor device, in which aluminum filled in a hole connecting wirings by CVD can be planarized.

The object of the present invention is achieved by the following multilevel interconnection forming method for forming a semiconductor device. Specifically, the multilevel interconnection forming method comprises steps of: depositing a metal film containing aluminum on an insulating film of a substrate and patterning the metal film, to form a wiring layer of the first layer; forming an interlayer dielectric film forming the part of the first layer, on an entire surface of the substrate, such that the interlayer dielectric film covers the wiring layer from upside; forming a hole at a predetermined position of the interlayer dielectric film such that the hole reaches the wiring layer of the first layer; selectively depositing and filling aluminum into the hole by a CVD method, such that the aluminum is filled at a volume ratio smaller than 100% with respect to the hole; removing the native oxide of the surface of filled aluminum by Ar etching processing and forming an active metal film on an entire upper surface of the interlayer dielectric film including the hole filled with the aluminum; forming a metal layer containing aluminum, on the active metal film; making the metal layer flow into the hole by reflowing, to completely fill the hole and to planarize the surface of the metal layer; and subjecting the metal layer to patterning, to form a wiring layer of a second layer, after the surface of the metal layer is planarized by the reflowing.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a table prepared by evaluating and comparing test results of a prior art example with test results of the present invention where actual processing was carried out, with variously changing the Ar etching processing for removing the native oxide film formed on the surface of the filled aluminum, the thickness of an active metal (Ti) film, the film forming temperatures for a Ti layer and a metal (Al alloy) layer, and the reflowing temperature.

DETAILED DESCRIPTION OF THE INVENTION

In the following, an embodiment of the present invention will be explained with reference to the drawings.

Figure 1:
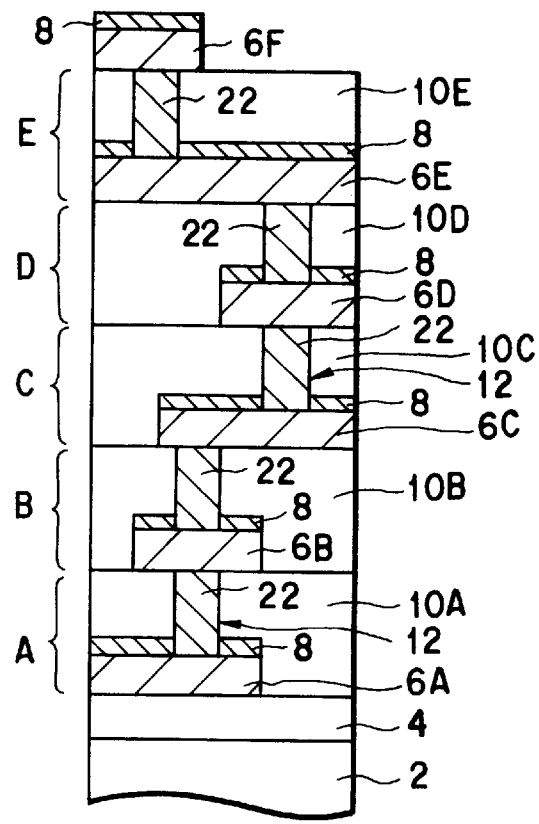
FIG. 1 is an enlarged sectional view showing an example of a multilevel interconnection structure of a semiconductor device formed in a method according to the present invention.

FIG. 1 is an enlarged sectional view showing a multilevel interconnection structure of a semiconductor device formed by a multilevel interconnection forming method according to an embodiment of the present invention. As shown in the figure, a semiconductor device 20 is formed in a multilevel structure consisting of five layers A to E. The first layer A as the lowermost layer is formed on a substrate (made of silicon or the like) 2 of a semiconductor wafer, with an insulating film 4 of $SiO_2$ or the like inserted therebetween. Second to fifth layers B to E are sequentially layered on the first layer A. A number of semiconductor elements not shown are incorporated in each of the layers A to E. In order to electrically connecting the semiconductor elements with each other within each of the layers A to E, patterned wiring layers 6A to 6E containing aluminum are respectively formed in the layers A to E. Further, in order to electrically insulate the layers A to E from each other, interlayer dielectric films 10A to 10E made of, for example, $SiO_2$ film are inserted in the layers A to E, respectively. Note that a patterned wiring layer 6F is formed on the upper end of the fifth layer E (or the uppermost end of the multilevel interconnection structure). Anti-reflection films 8 made of, for example, Ti (titanium) or TiN (titanium-nitride) are respectively formed on the wiring layers 6A to 6E of the layers A to E and the wiring layer 6F at the upper end, such that photolithography with excellent accuracy can be carried out by restricting reflection light during exposure. To electrically connect the wiring layers 6A to 6F of any adjacent two of the layers A to E with each other, via holes 12 are formed so as to respectively penetrate the interlayer dielectric films 10A to 10E, and plugs 22 are respectively formed in the via holes 12 by selectively depositing aluminum by means of a CVD method.

Figure 3:
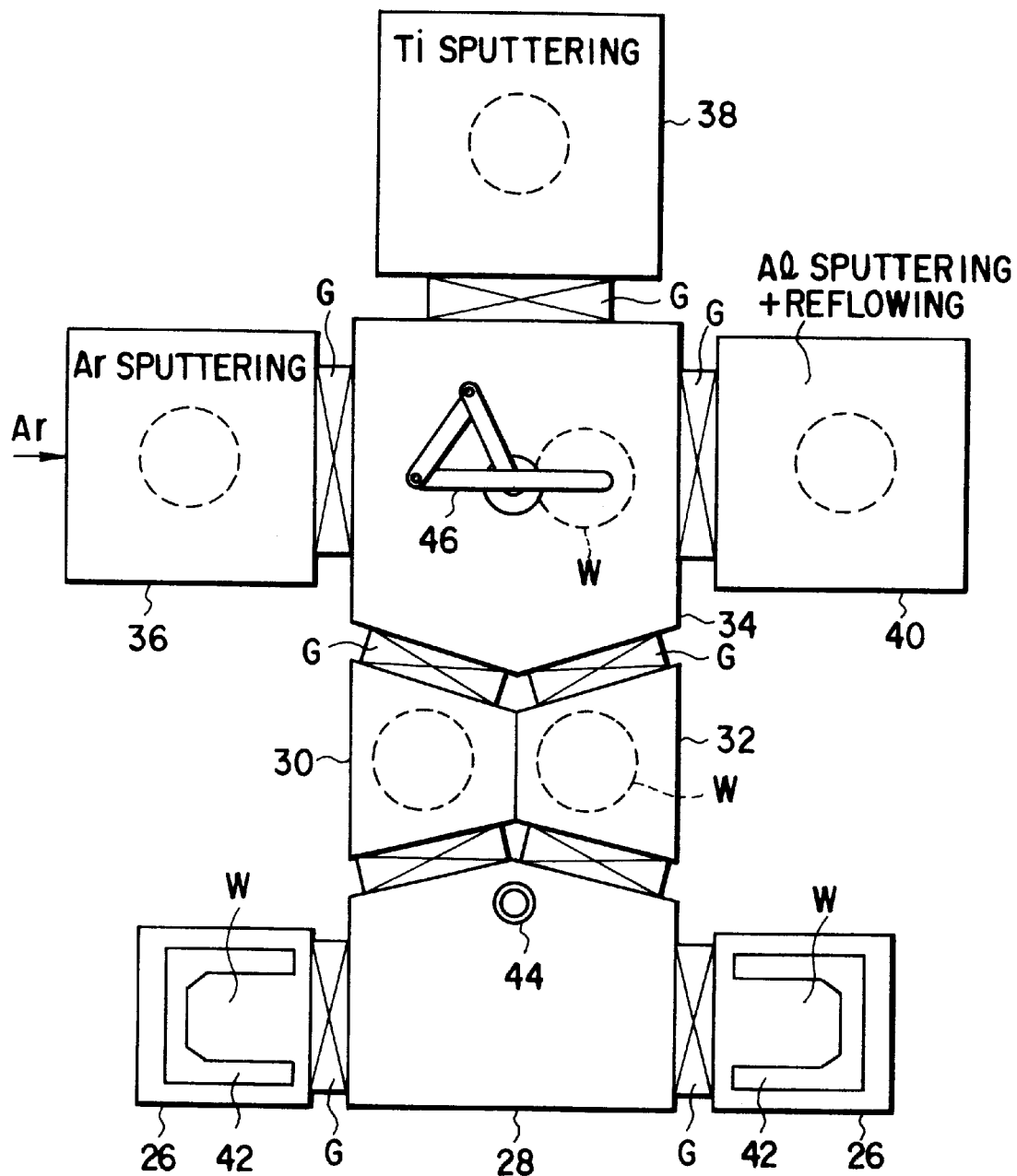
FIG. 3 is a view schematically showing a structure of a multi-chamber sputtering equipment for performing a part of the steps of the multilevel interconnection forming method according to the present invention.

FIG. 3 shows a multi-chamber sputtering equipment 24 for performing a part of steps of the multilevel interconnection forming method according to the present invention. The multi-chamber sputtering equipment 24 is mainly comprised of two cassette chambers 26, a loader chamber 28 connected to each of the cassette chambers 26, a degassing chamber 30 and a cooling chamber 32 both connected in parallel with the loader chamber 28, a transfer chamber 34 connected to each of the degassing chamber 30 and the cooling chamber 32, and three sputtering chambers 36, 38, and 40 each connected to the transfer chamber 34. Of the three sputtering chambers, native oxide film etching processing described later is carried out in the first sputtering chamber 36, and active metal film forming processing described later will be carried out in the second sputtering chamber 38. Metal layer forming processing and reflowing processing described later is carried out in the third sputtering chamber 40. Each of the chambers is air-tightly enclosed by a gate valve G. Note that the layout of the chambers is, of course, not limited to the layout as shown in FIG. 3.

Each cassette chamber 26 contains a cassette 42 capable of containing a plurality of semiconductor wafers W, for example, twenty five semiconductor wafers W. An orienter 44 for positioning wafers W is provided in the loader chamber 28. In the transfer chamber 34, there is provided a transport arm 46 for transporting the wafers between the sputtering chambers 36, 38, and 40 each other, between the sputtering chambers and the degassing chamber 30, as well as between the sputtering chambers and the cooling chamber 32. Note that the transport arm 46 is bendable and rotatable.

In the multi-chamber sputtering equipment 24, at first, wafers W (which are provided with plugs 22 described later) contained in a cassette 42 are transported into one of cassette chambers 26 from a CVD apparatus or the like not shown.

Subsequently, the wafers W in the cassette chamber 26 are transported into a first sputtering chamber 36, through a loader chamber 28, a degassing chamber 30, and a transfer chamber 34. The wafer 30 are subjected to native oxide film etching processing in the sputtering chamber 36, and thereafter, are subjected to active metal film forming processing in a second sputtering chamber 38 and further to metal layer forming processing and reflowing processing in a third sputtering chamber 40. Thereafter, the wafers W are contained into a cassette 42 in the other cassette chamber 26, through the cooling chamber 32 and the loader chamber 28.

Figure 4:
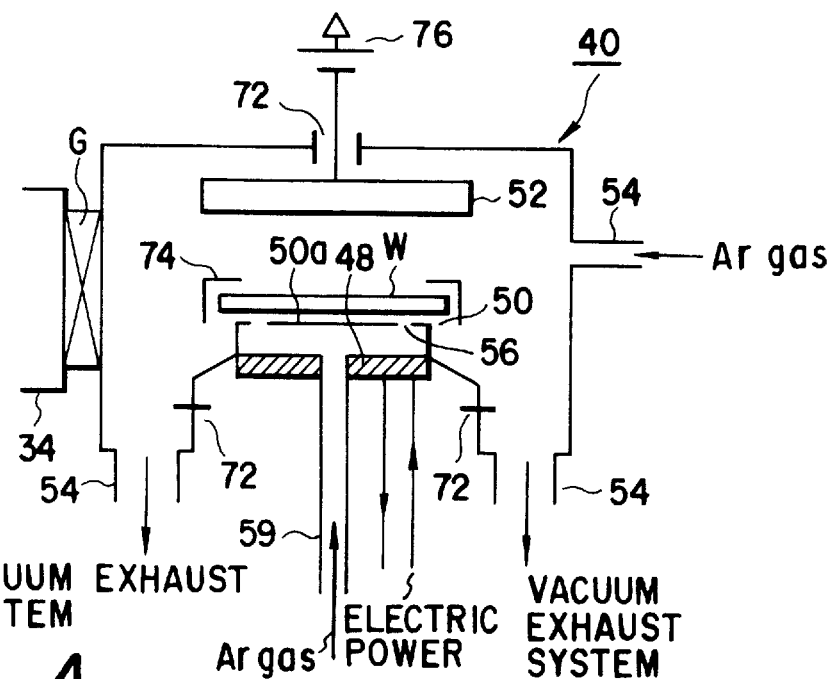
FIG. 4 is a view schematically showing a structure of a sputter chamber of the sputtering equipment shown in FIG. 3.

FIG. 4 schematically shows a structure of the third sputtering chamber 40 in which metal layer forming processing and reflowing processing are sequentially performed. In the third sputtering chamber 40, there are provided a wafer stage 50 including a heater 48 and a sputtering target 52 provided above and opposed to the wafer stage 50. A direct current source 76 is connected to the sputtering target 52 so that a DC bias is applied to the sputtering target 52. Note that the reference 72 denotes an insulating member 72 which provides electric insulation between the sputtering target 52 and the chamber 40 as well as between the wafer stage 50 and the chamber 40.

The wafer stage 50 is provided with a wafer clamp 74 for holding wafers W. On a side wall of the chamber 40, there is provided a gas nozzle 54 for introducing a sputtering gas into the chamber 40. An exhaust port 54 connected with a vacuum exhaust system not shown is provided at the bottom of the chamber 40. The wafer stage 50 is connected with a gas supply line 59 for supplying a heat-conductive gas consisting of, for example, an Ar gas or the like if necessary. The heat-conductive gas fed through the gas supply line 59 is supplied to the back side of the upper surface 50a of the wafer stage 50 and simultaneously to the front side of the upper surface 50a through heat-conductive gas holes 56 provided so as to penetrate the upper surface 50a. More specifically, during the metal layer forming processing in which a film of aluminum alloy is formed by sputtering is performed at a low temperature, supply of the heat-conductive gas through the gas supply line 59 is restricted or stopped, maintaining the heater 48 at a temperature higher than a processing temperature, so that the temperature of the wafer W is not much increased. Meanwhile, a necessary amount of heat-conductive gas is supplied during the reflowing processing, to ensure excellent heat-conductivity from the wafer stage 50 to the wafers W and to heat the wafers W to a reflowing temperature. If the heat-conductivity coefficient between the wafer W and the wafer stage 50 is changed and the temperature of the wafers W is thereby adjusted, by thus controlling the supply amount of the heat-conductive gas through the heat-conductive gas holes 56, two steps can be sequentially carried out in one single chamber, and besides, the temperature of the wafers W can be changed without changing the temperature of the heater 48, when the processing temperature must be changed between the two steps. It is therefore possible to rapidly set the temperature of the wafers to a predetermined processing temperature, and as a result, the processing efficiency can be improved.

Next, a method for forming the multilevel interconnection structure shown in FIG. 1 will be explained below with reference to FIGS. 2A to 2I.

Figure 2A:
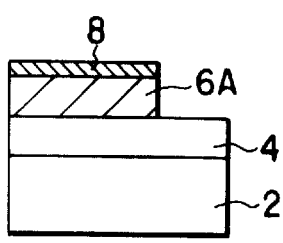
FIG. 2A is a sectional view of a wiring structure formed in a first step of the multilevel interconnection method according to the present invention.

At first, a number of semiconductor elements not shown and an insulator film 4 made of a silicon oxide film of about 5000 Å are formed on a silicon substrate 2 of 8-inch size, for example. Thereafter, a layered member, which consists of a metal film containing aluminum and an anti-reflection film 8 made of TiN or the like, is formed, for example, by sputtering. Further, the layered member is patterned by a photolithography method and a dry etching method, to form a wiring layer 6A of a first layer A. This state is shown in FIG. 2A. The wiring layer 6A may be entirely formed of only aluminum, or may contain a small amount of other elements, such as Cu, Si, and the likes, in addition to aluminum. Note that the anti-reflection film 8 is formed to prevent reflection light during exposure so that the exposure operation can be performed with high accuracy. However, the anti-reflection film 8 need not be formed if accuracy is not much significant. The thickness of the wiring layer 6A is set to about 5500 Å and the thickness of the anti-reflection film 8 is set to about 230 Å.

Figure 2B:
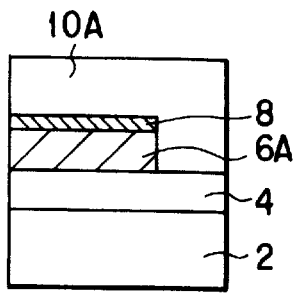
FIG. 2B is a sectional view of a wiring structure formed in a second step of the multilevel interconnection method according to the present invention.
Figure 2C:
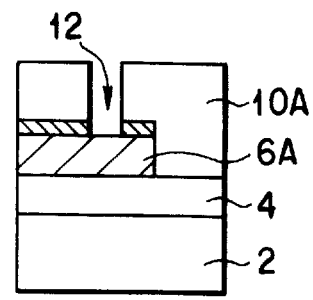
FIG. 2C is a sectional view of a wiring structure formed in a third step of the multilevel interconnection method according to the present invention.

After the wiring layer 6A is thus formed, an interlayer dielectric film 10A made of, for example, $SiO_2$ is formed over the entire surface of the substrate 2, for example, by plasma TEOS-CVD or the like, as is shown in FIG. 2B. In this case, the thickness of the interlayer dielectric film 10A is set to, for example, about 1 $\mu$m. Subsequently, the surface of the interlayer dielectric film 10A is polished and planarized by a CMP (Chemical Mechanical Polishing) method, and thereafter, photolithography operation and dry etching operation are performed to form a via hole 12 at a predetermined position of the interlayer dielectric film 10A, such that the hole 12 reaches the wiring layer 6A below. This state is shown in FIG. 2C. In this case, the diameter of the via hole 12 is set to, for example, about 0.2 $\mu$m to 0.5 $\mu$m in units of submicrons, and the aspect ratio of the hole is set to about 2 to 6 where the semiconductor device to be manufactured is a DRAM or the like.

Figure 2D:
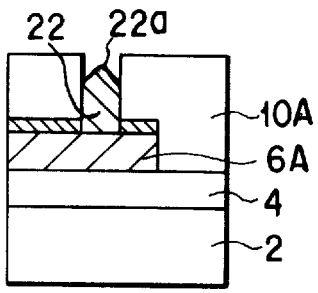
FIG. 2D is a sectional view of a wiring structure formed in a fourth step of the multilevel interconnection method according to the present invention.
Figure 2E:
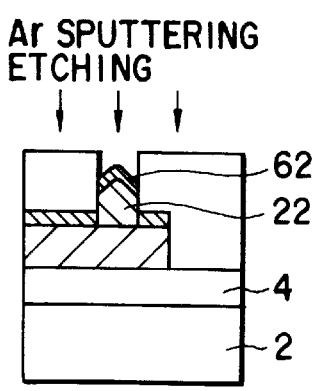
FIG. 2E is a sectional view of a wiring structure formed in a fifth step of the multilevel interconnection method according to the present invention.
Figure 2F:
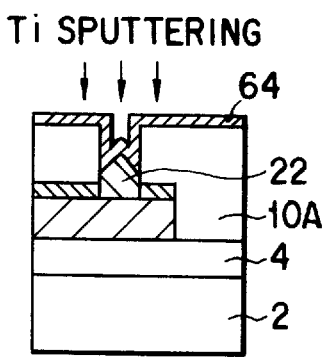
FIG. 2F is a sectional view of a wiring structure formed in a sixth step of the multilevel interconnection method according to the present invention.
Figure 2G:
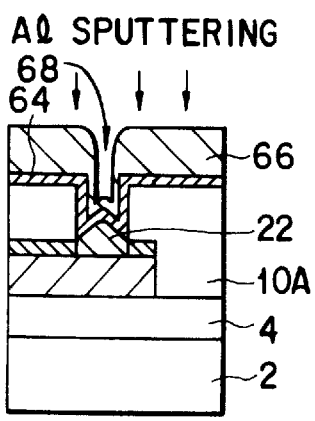
FIG. 2G is a sectional view of a wiring structure formed in a seventh step of the multilevel interconnection method according to the present invention.
Figure 2H:
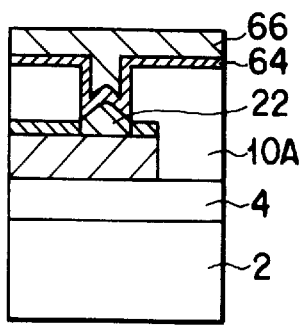
FIG. 2H is a sectional view of a wiring structure formed in an eighth step of the multilevel interconnection method according to the present invention.
Figure 2I:
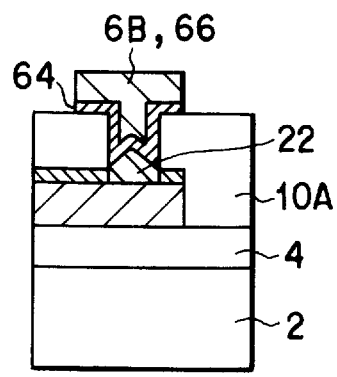
FIG. 2I is a sectional view of a wiring structure formed in a ninth step of the multilevel interconnection method according to the present invention.

After the via hole 12 is thus formed, aluminum is selectively deposited in the via hole 12 by CVD to form a plug 22 in the hole (see FIG. 2D). In this case, aluminum is filled so insufficiently that the volume ratio (or occupation ratio) of aluminum with respect to the hole 12 is smaller than 100%. In the selective CVD method for filling the hole 12 with aluminum, DMAH (dimethylaluminumhidride) is used as a processing gas, for example. Since DMAH exists in phase of a liquid having a very high viscosity coefficient at a normal temperature, DMAH is heated to a temperature lower than its decomposition temperature to lower the viscosity and then fed to a vaporizer. In the vaporizer, DMAH is vaporized by hydrogen or the like and then supplied into a processing vessel. As is well-known, a DMAH gas can make a heat-decomposition reaction and be deposited only on conductive material which has a high temperature. Therefore, aluminum is selectively deposited only in such a via hole 12 from the surface of the wiring layer 6A which is exposed at the bottom of the via hole. In this case, convex portion 22a is formed in the center of the plug 22. Therefore, the film forming period and the like are set such that the uppermost end of the convex portion 22a is equal to or lower than the level of the upper end opening portion of the via hole 12. In the present embodiment, a plug 22 having a height of about 0.85 $\mu$m is formed in a via hole 12 having a depth of about 1 $\mu$m, at a processing temperature of about 250° C. at highest. In this case, the volume ratio of the plug 22 with respect to the hole 12 is 80% in average. Note that the volume ratio of the plug 22 with respect to the hole 12 is desirably 50% or more in order to smoothly carry out filling processing by reflowing described later. If the via holes have different depths, the film forming period and the like are set such that all the via holes are insufficiently filled with aluminum at a volume ratio (or occupation ratio) smaller than 100%.

After the plug 22 is thus formed, the multi-chamber sputtering equipment 24 shown in FIG. 3 is used to carry out native oxide film etching processing, active metal film forming processing, metal layer forming processing, and reflowing processing.

At first, the wafers W having plugs 22 thus formed are transported, kept contained in the cassette 42, to one of cassette chambers 26 of the multi-chamber sputtering equipment 24 from a CVD apparatus or the like not shown in which a series of processing described above has been carried out. Subsequently, the wafers W are transported from the cassette chamber 26 into a first sputtering chamber 36 by a transport arm 46, through a loader chamber 28 and a degassing chamber 30, and a transfer chamber 34. In the first sputtering chamber 36, a native oxide film 62 sticking to the surface of a plug 22 is removed by sputtering etching using Ar gas (see FIG. 2E). In this case, the high frequency power and processing time period are controlled such that the sputtering amount falls within a range of about 50 Å to 600 Å in equivalent thickness of the thermal oxide film of Si. Note that the above-mentioned etching processing for removing the native oxide film 62 can be omitted if the amount of the native oxide film 62 sticking to the surface of the plug 22 is negligibly small.

After native oxide films 62 are removed from the surfaces of plugs 22, the wafers W are transported into a second sputtering chamber 38 by the transport arm 46. In the second sputtering chamber 38, an active metal film 64 is formed on the entire surface of each wafer W, including the surface of the plug 22 and the inner surfaces of the via hole 12 (see FIG. 2F). In the present embodiment, Ti (titanium) is used as active metal. Of course, another kind of metal belonging to the fourth group in the periodic table, such as Zr (zirconium) or Hf (hafnium), metal alloy of kinds of such metal may be used in place of Ti. Further, in the present embodiment, the active metal film 64 is formed to be thin, for example, within a thickness range of 10 Å to 400 Å. In this manner, wettability can be improved so that fluidization of aluminum can be accelerated during the reflowing processing described later. If the thickness of the active metal film 64 is smaller than 10 Å, aluminum alloy cannot sufficiently flow into the via hole 12 during the reflowing processing. Otherwise, if the thickness of the film 64 is greater than 400 Å, the electric resistance is undesirably increased at the part of the active metal film 64. Also, in the present embodiment, the max processing temperature for forming the active metal film 64 is set to 100° C. or less. This is because planarization by the reflowing processing is facilitated by reducing the grain size of the aluminum alloy at the forming step of the metal layer. If the processing temperature for forming the active metal film 64 is set to be higher than 100° C., the temperature of the wafer W is high at the early part of the metal layer forming step to be carried out next and the grain size of the aluminum the aluminum alloy becomes too large also, so that the conformal metal layer cannot be formed without difficulties. Specifically, it can be occurred that the aluminum or the aluminum alloy broken to portions, and therefore, sufficient fluidization cannot be achieved. As a result, there may be a case that the via hole 12 cannot sufficiently be filled or the surface cannot sufficiently be planarized even if reflowing processing is carried out.

After the active metal film forming processing is completed as described above, the wafers W are transported into the third sputtering chamber 40, by the transport arm 46. In the third sputtering chamber 40, a metal layer 66 made of, for example, aluminum or aluminum alloy is formed on the entire surface of each wafer W by sputtering (see FIG. 2G). In the present embodiment, AlCu is used as the aluminum alloy, and the layer has a thickness of about 5500 Å for example. In this case, a concave portion 68 is formed in a portion corresponding to the via hole 12. This is because aluminum forming a plug 22 is insufficiently filled at a volume ratio (or occupation ratio) smaller than 100% with respect to a hole 12. Note that the processing temperature during the sputtering is set such that the temperature of the wafer W is 100° C. or less in early part of the step of forming the film and is 250° C. or less, at most, even when the temperature of the wafer W increases during the steps of forming the film, for the same reasons as those in the case of forming an active metal film 64 described before. In this manner, the grain size is reduced so that fluidization is easily generated during the reflowing processing. In order to set the temperature of the wafers W to 100° C. or less, the flow rate of the heat-conductive gas (Ar) supplied between the wafer stage 50 and the wafers W is restricted or reduced to zero, so that the heat resistance between the wafer stage 50 and the wafers W is set to be large. Note that the temperature of the heater 48 at this time is set to be higher than the reflowing temperature as will be described later.

After the metal layer 66 is thus formed, reflowing processing is carried out to increase the temperature of the wafer W. In this reflowing processing, aluminum alloy forming the metal layer 66 is heated, thereby causing fluidization of aluminum alloy, and aluminum alloy flows into the via hole 12 due to this fluidization. In this manner, the concave portion 68 is filled with aluminum alloy and the surface is planarized (see FIG. 2H). In this case, the volume of the concave portion 68 is very small due to existence of the plug 22, and therefore, the reflowing temperature may be set within a relatively low temperature range of, for example, about 350° C. to 420° C. The reflowing temperature is lower than the reflowing temperature (e.g., 450° C.) adopted in a conventional filling method. Therefore, organic material having a low dielectric constant, which has a low heat resistance, can be used for forming an interlayer dielectric film. Of course, the reflowing temperature may be set to a high temperature of, for example, 450° C. or more in case where an interlayer dielectric film having a low heat resistance is not used. In order to increase the temperature of the wafer W to the reflowing temperature, a heat-conductive gas is supplied between the wafer stage and the wafers W through the gas supply line 59. In this manner, the heat-conductivity between the wafers W and the wafer stage 50 is increased so that the temperature of the wafers W can be rapidly increased.

After the reflowing processing is thus completed, the wafers W are taken out of the multi-chamber sputtering equipment 24. Further, the metal layer 66 is subjected to patterning by another processing apparatus, thereby to form a wiring layer 6B of a second layer B (see FIG. 2I). Of course, the wiring layer 6B is electrically connected to the wiring layer 6A through aluminum (of a plug 22) filled in a via hole 12, and is also electrically connected to semiconductor elements not shown in the second layer B.

Further, the same steps as shown in FIGS. 2A to 2H are repeated to form a multilevel interconnection structure as shown in FIG. 1.

Figure 6A:
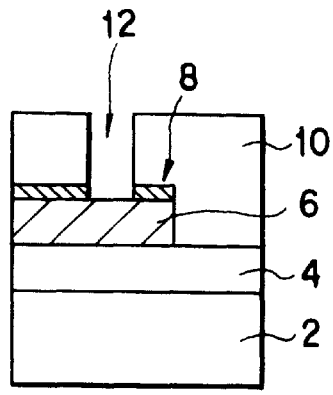
FIG. 6A is a sectional view of a wiring structure formed in a first step of a prior art multilevel interconnection forming method.
Figure 6B:
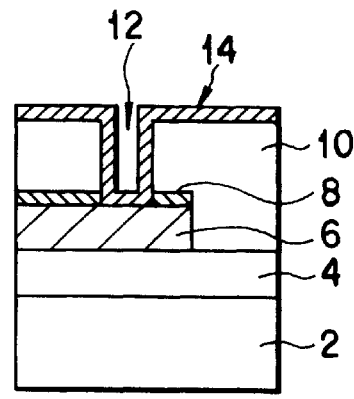
FIG. 6B is a sectional view of a wiring structure formed in a second step of a prior art multilevel interconnection forming method.
Figure 6C:
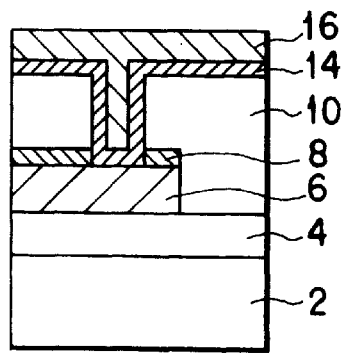
FIG. 6C is a sectional view of a wiring structure formed in a third step of a prior art multilevel interconnection forming method.
Figure 6D:
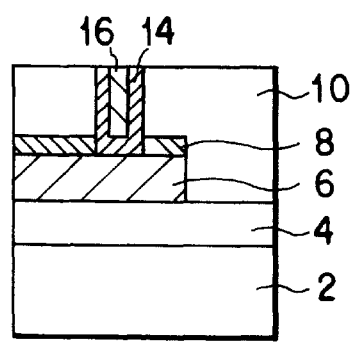
FIG. 6D is a sectional view of a wiring structure formed in a fourth step of a prior art multilevel interconnection forming method.
Figure 6E:
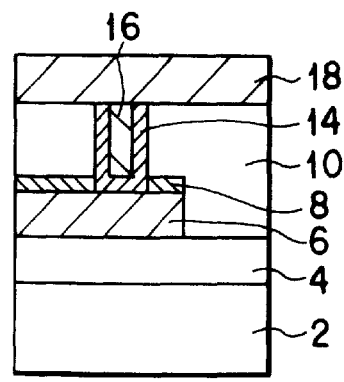
FIG. 6E is a sectional view of a wiring structure formed in a fifth step of a prior art multilevel interconnection forming method.

As has been explained above, according to the multilevel interconnection forming method of the present embodiment, a via hole 12 is selectively filled with aluminum by a CVD method. It is therefore possible to form a direct connection structure of Al—Al in which upper and lower wiring layers 6A to 6F made of aluminum are connected with each other by aluminum which is the same metal forming the wiring layers. (Ti forming an active metal film 64 exists diffusing in the aluminum or aluminum alloy forming a metal layer 66.) Thus, aluminum portions are directly connected to each other. Therefore, tungsten which has a higher electric resistance than aluminum is not used to connect wiring layers 6A to 6F, and as a result, the electric resistance is reduced to be low, so that a semiconductor device thus manufactured is capable of responding to a micro processor or the like which is particularly required to satisfy demands for a higher operation speed. In addition, since tungsten is not used, a barrier metal 14 (shown in FIG. 6B) need not be formed, unlike in a conventional method, and therefore, the number of manufacturing steps can be reduced.

Further, in the multilevel interconnection forming method, a via hole 12 is insufficiently filled with aluminum forming a plug 22 at a volume ratio (or occupation ratio) smaller than 100% with respect to the hole 12, and the remaining vacant space of the hole 12 is filled by reflowing processing. Therefore, a multilevel interconnection structure which ensures high reliability, low resistance, and excellent flatness can be formed by a small number of processing steps.

In addition, according to the multilevel interconnection forming method, an anti-reflection film is formed on each of the wiring layers 6A to 6E, and therefore, reflection of light from the wiring layers 6A to 6E is prevented, so that exposure processing can be performed with high accuracy. Further, since native oxide films on plugs 22 are removed by etching before forming wiring layers 6A to 6E, the electric resistance between the wiring layers 6A to 6E is very small.

FIG. 5 shows a table in which evaluation results obtained by actually performing processing according to the multilevel interconnection method of the present invention (Embodiments 1 to 9) are compared with evaluation results obtained by performing processing according to a conventional method (Comparative Example 1) in which no Ti film is formed and reflowing processing is not carried out. The processing according to the method of the present invention was carried out variously changing the sputtering amount in the native oxide film removing processing, the thickness of the active metal (Ti) film, the film forming temperatures for the active metal (Ti) film and the metal (Al alloy) layer, and the reflowing temperature. In the table, the term of "(OVER)" means that the associated value is over that of the best mode (Example 1), while the term of "(UNDER)" means that the associated value is under that of the best mode (Example 1). The evaluation results of chain resistance and chain yield evaluated in the comparative example 1 and embodiments 1 to 9 are average values obtained by making measurement on one hundred chains each consisting of forty hundreds of plugs 22. The EM (Electro-migration) lifetime is a result obtained by making a test at a circumferential temperature of 150° C. with a stress of current density of 7.5 MA/cm$^2$ applied, and is also an average value by making measurement on five chains each consisting of four hundreds plugs 22.

As is apparent from the table shown in FIG. 5, the chain resistance of the comparative example 1 is considerably high and the EM lifetime therefor is the shortest in the table. In contrast, the embodiment 1 as the best mode as well as the embodiment 9 show excellent values with respect to the chain resistance, yield, and EM lifetime. In the embodiment 9 in which the reflowing temperature is set to be high, however, clacks occur in an insulator film when using organic material having a low dielectric coefficient which has a low heat resistance and is suitable for high speed operation, such as an organic-based SOG insulator film. Therefore, the embodiment 9 cannot be called a best mode.

Meanwhile, in each of embodiments 2 to 8, the EM life time is longer than that of the comparative example (but is shorter than that of the embodiment 1), and the chain resistance and yield are worse than those of the embodiment 1.

From the results shown in FIG. 5, the following can be concluded with respect to the thickness of a Ti film, the reflowing temperature, the film forming temperatures for an active metal (Ti) film and a metal (Al alloy) layer.

(1) Thickness of Ti Film

The thickness of a Ti film should be within a range of 10 Å to 400 Å as shown in the embodiments 4 and 5, and desirably be within a range of 20 Å to 100 Å including 50 Å at the center, as shown in the embodiment 1.

(2) Reflow Temperature

The reflowing temperature should be within a range of 300° C. to 500° C. as shown in the embodiments 8 and 9, and desirably be within a range of 350° C. to 420° C., taking into consideration sufficient fluidization and heat-resistance of an interlayer dielectric film having a low dielectric coefficient.

(3) Film Forming Temperature for Active Metal Film (Ti)

The film forming temperature for an active metal film should be 100° C. or less, as shown in the embodiment 6, and preferably be 70° C. or less.

(4) Film Forming Temperature for Metal (Al Alloy) Layer

The film forming temperature for a metal layer should be 250° C. or less, as shown in the embodiment 7, and preferably be 100° C. or less.

In the above embodiments, the semiconductor device 20 is formed in a structure consisting of five layers. The present invention, however, is not limited to this structure, but the structure of the semiconductor device may consist of four or less layers or six or more layers. Further, the method of the present invention is applicable not only to form a layer on a silicon substrate as in the above embodiments, but also to form a layer on a glass substrate, an LCD substrate and the likes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multilevel interconnection forming method for a semiconductor device, comprising steps of:

depositing a metal film containing aluminum on an insulating film of a substrate and patterning the metal film, to form a wiring layer of a first layer;

forming an interlayer dielectric film forming part of the first layer, on an entire surface of the substrate, such that the interlayer dielectric film covers an upper surface of the wiring layer;

forming a hole at a position of the interlayer dielectric film such that the hole reaches the wiring layer of the first layer;

selectively depositing and filling aluminum into the hole by a CVD method at a processing temperature of 250° C. or lower, such that the aluminum is filled at a volume ratio equal to or larger than 50% and smaller than 100% with respect to the hole;

forming a foundation metal film on an entire upper surface of an interlayer dielectric film including the hole filled with thin aluminum at a processing temperature of 100° C. or lower, to have a thickness within a range between 10 Å and 400 Å;

forming a metal layer containing aluminum, on the foundation metal film at a processing temperature of 250° C. or lower;

making the metal layer flow into the hole by reflowing, to completely fill the hole and to planarize the surface of the metal layer; and subjecting the metal layer to patterning, to form a wiring layer of a second layer, after the surface of the metal layer is planarized by the reflowing.

2. A multilevel interconnection forming method for a semiconductor device, according to claim 1, wherein a layered member consisting of a metal film containing aluminum and an anti-reflection film formed on the metal film is formed on the insulating film of the substrate, and the layered member is subjected to patterning to form the wiring layer of the first layer.

3. A multilevel interconnection forming method for a semiconductor device, according to claim 1, wherein the native oxide film sticking to a surface of the aluminum filled in the hole is removed by etching in a range between 50 Å and 600 Å, before the foundation metal film is formed after the hole is filled with the aluminum at the volume ratio equal to or larger than 50% and smaller than 100% with respect to the hole.

4. A multilevel interconnection forming method for a semiconductor device, according to claim 1, wherein the aluminum filled in the hole is has an uppermost end positioned to be equal to or lower than a horizontal level of an upper opening portion of the hole.

5. A multilevel interconnection forming method for a semiconductor device, according to claim 1, wherein the foundation metal film is made of titanium, hafnium, or zirconium.

6. A multilevel interconnection forming method for a semiconductor device, according to claim 1, wherein the metal layer containing aluminum is formed on the foundation metal film and a surface of the metal layer is planarized by the reflowing, in one single chamber of a processing apparatus.

7. A multilevel interconnection forming method for a semiconductor device, according to claim 6, wherein:

the chamber includes a stage having a mounting surface for mounting the substrate and a heater for heating the substrate placed on the mounting surface; and a heat conductivity between the substrate and the stage differs between the step of forming the metal layer containing aluminum on the foundation metal film and the step of planarizing the surface of the metal layer by the reflowing.

8. A multilevel interconnection forming method for a semiconductor device, according to claim 7, wherein:

the chamber includes a gas supply line for supplying a heat-conductive gas to the stage; and the supply of the heat-conductive gas through the gas supply line is suppressed or stopped when the metal layer containing aluminum is being formed on the foundation metal film, while a necessary amount of heat-conductive gas is supplied through the gas supply line when the surface of the metal layer is being planarized by the reflowing.

9. A multilevel interconnection forming method for a semiconductor device, according to claim 1, further comprising steps of:

forming an interlayer dielectric filling forming part of the second layer and an entire surface of the substrate such that the interlayer dielectric film thereby formed covers an upper surface of the wiring layer of the second layer, after the wiring layer of the second layer is formed;

forming a hole at a position of the interlayer dielectric film such that the hole reaches the wiring layer of the second layer;

selectively depositing and filling aluminum into the hole by a CVD method at a processing temperature of 250° C. or lower, such that the aluminum is filled at a volume ratio equal to or larger than 50% and smaller than 100% with respect to the hole;

forming a foundation metal film on the entire upper surface of an interlayer dielectric film including the hole filled with the aluminum at a processing temperature of 100° C. or lower, to have a thickness within a range between 10 Å and 400 Å;

forming a metal layer containing aluminum, on the foundation metal film at a processing temperature of 250° C. or lower;

making the metal layer flow into the hole by reflowing, to completely fill the hole and to planarize the surface of the metal layer; and subjecting the metal layer to be patterned, to form a wiring layer of a third layer, after the surface of the metal layer is planarized by the reflowing.

10. A multilevel interconnection forming method for a semiconductor device, according to claim 9, wherein a layered member consisting of a metal film containing aluminum and an anti-reflection film formed on the metal film is formed on the insulating film of the substrate, and the layered member is subjected to patterning to form the wiring layer of the second layer.

11. A multilevel interconnection forming method for a semiconductor device, according to claim 9, wherein a native oxide film sticking to a surface of the aluminum filled in the hole is removed by etching in a range between 50 Å and 600 Å, before the foundation metal film is formed after the hole is filled with the aluminum at the volume ratio equal to or larger than 50% and smaller than 100% with respect to the hole.

12. A multilevel interconnection forming method for a semiconductor device, according to claim 9, wherein the aluminum filled in the hole is has an uppermost end positioned to be equal to or lower than a horizontal level of an upper opening portion of the hole.

13. A multilevel interconnection forming method for a semiconductor device, according to claim 9, wherein the foundation metal film is made of titanium, hafnium, or zirconium.

14. A multilevel interconnection forming method for a semiconductor device, according to claim 9, wherein the metal layer containing aluminum is formed on the foundation metal film and a surface of the metal layer is planarized by the reflowing.

15. A multilevel interconnection forming method for a semiconductor device, according to claim 14, wherein:

the chamber includes a stage having a mounting surface for mounting the substrate and a heater for heating the substrate placed on the mounting surface; and a heat conductivity between the substrate and the stage differs between the step of forming the metal layer containing aluminum on the foundation metal film and the step of planarizing the surface of the metal layer by the reflowing.

16. A multilevel interconnection forming method for a semiconductor device, according to claim 15, wherein:

the chamber includes a gas supply line for supplying a heat-conductive gas to the stage; and the supply of the heat-conductive gas through the gas supply line is suppressed or stopped when the metal layer containing aluminum is being formed on the foundation metal film, while a necessary amount of heat-conductive gas is supplied through the gas supply line when the surface of the metal layer is being planarized by the reflowing.

17. A multilevel interconnection forming method for a semiconductor device, according to claim 9, wherein all the steps according to claim 10 are repeatedly performed.

18. A multilevel interconnection forming method for a semiconductor device, according to claim 9, wherein the surface of the metal layer is planarized by the reflowing at a processing temperature between 300° C. and 450° C.

19. A multilevel interconnection forming method for a semiconductor device, according to claim 1, wherein the surface of the metal layer is planarized by the reflowing at a processing temperature between 300° C. and 450° C.

* * * * *